United States Patent [19]

Chen et al.

[11] 3,997,880
[45] Dec. 14, 1976

[54] APPARATUS AND MACHINE IMPLEMENTABLE METHOD FOR THE DYNAMIC REARRANGEMENT OF PLURAL BIT EQUAL-LENGTH RECORDS

[75] Inventors: Tien Chi Chen, San Jose; Chin Tung, Saratoga, both of Calif.

[73] Assignee: International Business Machines Corporation, Armonk, N.Y.

[22] Filed: Mar. 7, 1975

[21] Appl. No.: 556,377

[52] U.S. Cl. .................. 340/172.5; 340/174 TF
[51] Int. Cl.² .................. G11C 11/14; G11C 19/00
[58] Field of Search .... 340/172.5, 174 SR, 174 TF, 340/174 AA, 174 FB

[56] References Cited
UNITED STATES PATENTS

| | | | |
|---|---|---|---|
| 3,543,255 | 11/1970 | Morrow | 340/174 |
| 3,704,452 | 11/1972 | Beausoleil | 340/172.5 |
| 3,766,534 | 10/1973 | Beausoleil | 340/172.5 |
| 3,781,821 | 12/1973 | Roth | 340/172.5 |
| 3,798,607 | 3/1974 | Minnick | 340/172.5 |
| 3,806,901 | 4/1974 | Buhrer | 340/174 TF |
| 3,810,112 | 5/1974 | Aho | 340/172.5 |

*Primary Examiner*—Gareth D. Shaw
*Assistant Examiner*—James D. Thomas
*Attorney, Agent, or Firm*—R. Bruce Brodie

[57] ABSTRACT

An apparatus for performing efficient transposition exchange sorts among equal length records is described. The apparatus takes advantage of the flow steering property of linkable circulating storage loops to minimize the average access time by positioning information closer to the output port in a storage structure. The apparatus is formed from a linear array of equal size shift register loops each holding one record. The loops are switchably interconnected such that when two boundary switches are set in a first mode, the contents of each loop normally circulate wholly therewithin. Upon a common boundary switch being set in a second mode, the contents within a first loop flow into a second loop and vis-a-vis. By setting a common boundary switch to the second mode, the contents of a pair of adjacent loops are exchanged in the duration of one loop cycle time. Further exchanges can be started before a previous one is complete; this overlapping of operations can lead to an effective exchange rate of two exchanges per loop cycle. By repeating the exchange for consecutive pairs of loops, then the contents of any reference loop can be migrated to an output port D loops away in (D + 1)/2 loop cycle times.

10 Claims, 18 Drawing Figures

UNIFORM LADDER

ARRANGEMENT OF FILED RECORDS POSED FOR OUTPUT

TOPPING OPERATIONS OVER D=2

APPARATUS AND MACHINE IMPLEMENTABLE METHOD FOR THE DYNAMIC REARRANGEMENT OF PLURAL BIT EQUAL-LENGTH RECORDS

BACKGROUND OF THE INVENTION

This invention relates to the flow steering property of linkable reentrant loops to minimize the average access time by positioning information closer to an output port in a storage structure. More particularly, the invention relates to the use of a linear array of linkabe circulating storage loops for storing a working set of records forming a small subset of the total information utilized by a stored programmed controlled information handling system, the "working set" having a high probability of computer program use in the near future and having a size and content changing only slowly with time.

Broadly, Bonyhard and Nelson at page 308 of the March 1973 issue of the Bell System Technical Journal describe the dynamic reallocation of data in a system of closed loop shift registers. The authors point out how dynamic reallocation of data can be combined with major/minor loop organization so as to optimize memory performance. Included in their description is the use of a process of propagating forward $n$ cycles, removing bits from a channel, closing the gap, propagating backwards $n$ cycles, opening a gap and reinserting information in order to effectuate permutation of information in a channel.

There are numerous prior art structures showing the control of bits among the stages of a shift register. Reference can be made to C. K. Wong et al, "The Anticipatory Control of a Cyclically Permutable Memory", *IEEE Transactions on Computers*, May 19, 1973, pages 481–488; W. F. Beausoleil, U.S. Pat. 3,670,313; A. V. Aho et al, "Dynamic Memories With Rapid Random and Sequential Access", *IEEE Transactions on Computers*, March, 1974, at page 272.

It is observed in the Bonyhard reference that there is no ordering of records effectuated by a direct information exchange between adjacent loops. Moreover, in the remaining cited references, the bit-oriented permutations do not optimize permutations and sorts as among plural bit equal-length records, for example.

As suggested above, the location of a record can be exploited to reduce average access time by dynamically positioning the record close to the access mechanism. Relatedly, dynamic positioning has meant data reassignment using a storage hierarchy. Frequently the assumption is that all storage positions are equally accessible. This assumption of equal accessibility is valid for random access memories. However, storage based on shift registers such as magnetic bubbles (Beausoliel, U.S. Pat. No. 3,670,313) and charge coupled technology (W. Anacker, "Possible Uses of Charge Transfer Devices and Magnetic Domain Devices in Memory Hierarchies," *IEEE Transaction on Magnetics*, September 1971, pages 410–415; W. S. Boyle et al, BSTJ, April 1970, pages 587–593) is strongly affected by geometric factors.

Attention is directed to co-pending U.S. patent application, Ser. No. 556,378, filed on Mar. 7, 1975, entitled "Ladder For Information Processing", filed by Chang, Chen and Tung. In the co-pending case, Chang et al describes an apparatus for dynamically permuting a linear list coupled with fixed-length records. This can be stated less formally as an arrangement with multiple shift register loops linked by dual moded switches. Since each loop has no more than two adjacent, switchably interconnected neighbors, then when the two boundary switches to any given loop are set in the first mode of the fixed-length records circulate wholly within its counterpart loop. When a common boundary switch is set in a second mode, then each fixed-length record flows into an adjacent loop and vis-a-vis. Such a structure has been nominated as a "ladder" or a "ladder network".

SUMMARY OF THE INVENTION

It is accordingly an object of this invention to modify an arrangement of multiple, linkable circulating storage loops by taking advantage of the flow steering properties thereof and controlling thereof and constraining them so as to minimize the average access time through positioning information closer to the output port in a storage structure. It is a related object that the "topping" property be achieved by contiguous neighbor exchange as described, for example, in Knuth, sorting and Searching, Addison-Wesley Publishing Company, 1973, LC 67-26020-; and minimum travel or migration.

The foregoing objects are satisfied by an apparatus for dynamically permuting a linear list populated with fixed-length records. The apparatus comprises a plurality of equal size loops and a plurality of individually operable, dual-moded switches. The switches are distributed such that the loops are arranged in linked, linear fashion and, further, that each loop has no more than two adjacent, switchably interconnected neighbors. Each fixed-length record circulates wholly within its counterpart loop upon the two boundary switches thereto being set in a first mode. Each fixed-length record in a counterpart loop flows into an adjacent loop and vis-a-vis upon their common boundary switch being set into a second mode. The apparatus further comprises means for exchanging the contents of the ith loop from the input/output end with the contents of the (i-l)st loop by setting the common boundary switch into the second mode for a duration of one-half loop cycle time, and for repeating the exchange for consecutive pairs of loops until the contents of the ith loop reaches the end loop. By repeating the exchange for consecutive pairs of loops, the contents of any reference loop can be migrated to an output port D loops away in (D+ 1/2) loop cycle times.

The invention is directed to the dynamic ordering of long, fixed-length records among loops of equal length that are linearly linked with switchable crossovers therebetween. It is important to distinguish between two prior art aspects. First, systems of shift registers have long been used for bit-array manipulation. However, bit-array manipulation usually contemplates the high involvement of neighboring information elements requiring arithmatic calculation or logical operations. In contrast, the apparatus of this invention is directed to storage management. Storage management emphasizes data movements with only a limited notion of neighbor element and does not involve arithmetic operations.

This invention treats strings of bits as units of processing, not as single bits. Also, the invention treats processing by displacement and rearrangement, rather than by arithmetic.

This invention is also distinguished over the aforementioned co-pending Chang application. The Chang case while using switchably linearly linked loops nevertheless contains double-sized loops, each one holding two records except for the top loop. The Chang case uses four modes of switching in dynamic ordering. In comparison with this invention, the Chang case requires for D loops the lesser of 2D or 2(n-D)-1 loop cycles. In contrast in the invention, all loops are of equal length, each holding but one record. All switches linking the loops can be set freely, yielding $2^{n-1}$ modes of switching, rather than 4. The invention has as its object that of exploiting the freedom of switching such as by dynamically ordering among D loop levels, the minimum migration of a record being (D + 1/2) loop cycle times.

DESCRIPTION OF THE PREFERRED EMBODIMENT

The design of the description of the preferred embodiment will, in general, follow the order of the drawings. First, the dual-mode or crossover switch represented in FIGS. 1A and B will be described. This is followed by a discussion of a physical implementation of a multi-looped ladder linked by the dual mode switch. The remaining discussion in FIGS. 2–9 is directed to how a uniform bubble ladder takes advantage of the data flow steering control property of the linkable circulating storage loops so as to minimize the average access time by migrating information closer to the output port in the storage structure.

Figure 1A:
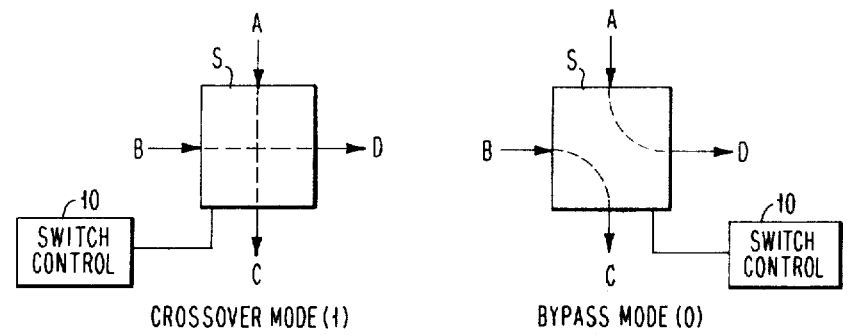
FIGS. 1A, B and C, respectively, show the dual mode or binary switch; implementation of the switch in guided magnetic bubble technology; and physical implementation of the linked reentrant loops using the dual mode switch, respectively.

Referring now to FIG. 1A, there is shown a binary switch capable of directing two guided streams of magnetic bubbles in two distinct modes. In the first, or crossover mode, bubbles applied along path A at the switch input exit at path C at the output. Likewise, bubbles present at input B exit at output D. Likewise, in the second, or bypass mode, inputs at A and B of the switch S respectively output through D and C.

In the following explanation it will be assumed that the switch and later described structures are fabricated from magnetic bubble domain devices and that the data streams are bubble domain streams. However, as will be pointed out later other technologies, such as semiconductor charge-coupled devices, can be used also to implement the structures.

Figure 1B:
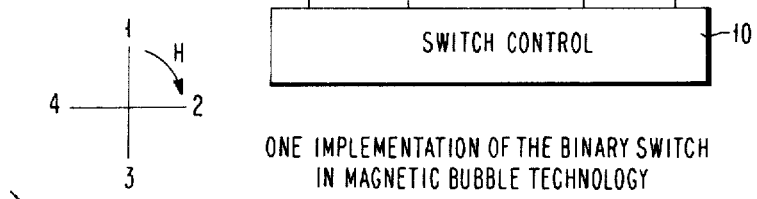

Referring again to FIGS. 1A and B, it has been shown by Morrow et al, U.S. Pat. No. 3,543,255, issued Nov. 24, 1970, entitled "Single Wall Domain Apparatus Having Intersecting Propagation Channels", that two bubble streams can cross each other at different phases of the same drive field cycle via an idler type device without destructive interference. The required dual mode (binary) switch can be obtained by modifying this device and adding conductors for control purposes as shown in FIG. 1B, elements 14A–B. The switch itself consists of magnetic elements such as the T and I 12 described in copending Chang application. As such, the switch is essentially the same as shown in the Morrow patent, except that control means have been provided for changing the mode of operation of the switch. Thus, rather than having data streams A and B cross over each other at all times, the operation of switch S can be controlled so that the data streams A and B can be made by bypass one another. In FIG. 1B, conductors 14A and B, connected to switch control 10, are used to place the switch in the bypass mode of operation. That is, when currents are present in these conductors, input stream A will enter switch S and leave via path D, while input stream B will enter switch S and leave via path C. Conductors 14A and 14B have portions of reduced with so that they will produce different magnetic field gradients for diverting the bubble streams A and B in order to achieve the bypass operation. When no currents are present in conductors 14A and 14B, the bubble streams A and B crossover one another. The crossover operation depends upon the action of the bubble domain idler I located in the center of switch S. The bubble domain BD in the idler will be kicked out of the idler by a bubble in the input data stream, which data bubble will then stay in the idler and be the next bubble to be kicked out when the next data bubble enters. Thus, the idler bubble is always replenished from the input data bubbles and the idler bubble is always kicked out of the idler each time a data bubble enters the idler. The input bubble streams cross one another at different phases of drive field H cycle and, therefore, no destructive interference of the data streams occur.

More particularly, the dual mode switch S consists of magnetic elements 12 located adjacent to a magnetic medium 16 in which the bubble domains exist. Magnetic elements 12 provide propagation paths for the bubble domain streams A and B. The intersection point of the bubble domain streams A and B consist of an idler I. A bubble domain BD resides in the idler and continuously circulates in the idler in response to different orientations of the field H. Conductors 14A and B can be located either over the magnetic elements 12 or under them.

To explain the bypass operation, it is assumed that field H rotates in a clockwise direction as shown. At field phase 3, the leading bit position of input stream A is labeled A, the leading bit position of stream B is labeled B, the trailing bit position on path C is labeled C, and the trailing bit position on path D is labeled D. When control conductors 14A and B are not activated, then switch S operates in the crossover mode. In this mode, the bit at position "A" will be connected to the bit at position "C", while the bit at "B" will be connected to the bit at "D". During activation of the control conductors, crossover idler I is bypassed. If the bypass action is started at field phase 3, a current through conductor 14B during field phases 4 and 1 will cause transfer of a bubble domain at bit position "B" to pole position 4' on magnetic element 18. The bubble remains there until field phase 2, at which time it will travel to position "C". Correspondingly, a current in conductor 14A during field phase 1 steers a bubble domain at bit position "A" to bit position "B" (pole position 3 on modified Y bar 20). When the bit is converted from the crossover mode to the bypass mode no excess bubble domain is left behind in the idler except the idler bubble itself. Additionally, no gap is created when converting from the bypass mode back to the crossover mode.

Figure 1C:
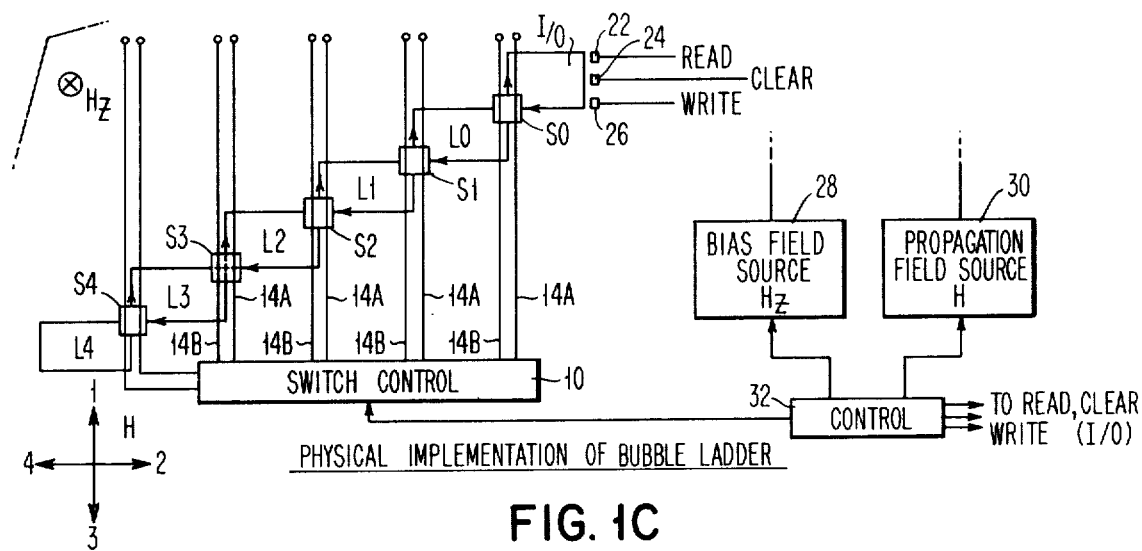
Figure 3:
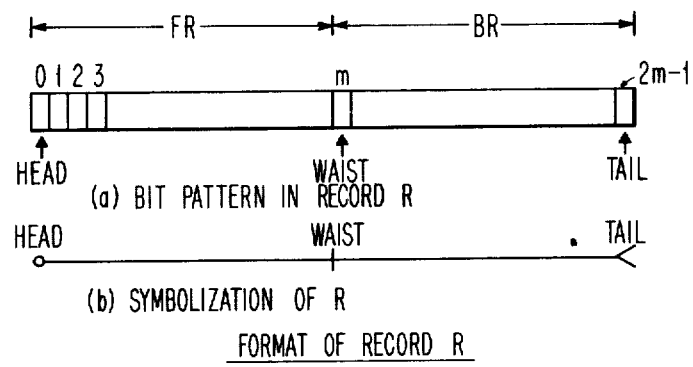
FIG. 3 sets forth the multi-bit format for the fixed-lenth records stored in respective equal-length loops.

Referring now to FIG. 1C, there is shown a physical implementation of a bubble ladder. The ladder consists of a sequence of bubble storage loops linkable in a ladder-like manner. The loops are interconnected by switches as described above at the intersections between the loops. The provision of dual mode switches at the intersections of the loops loops enables data in the to idle around each separate loop or to be interconnected in a sequential fashion.

Referring more particularly to FIG. 1C, a plurality of shift register loops L0, L1, L2, L3 and L4 are interconnected by dual mode switches 50, 51, 52, 53, 54. Additionally, loop L1 is interconnected with an input/output I/O loop, switch 50 being the same as switches 51–54. Associated with the I/O loop are read circuits 22, a clear circuit 24 and a write circuit 26.

Switches 51–54 have their modes of operation determined by the presence and absence of currents on the associated conductors 14A and B. Currents in these conductors are under control of switch control unit 10. Unit 10 can operate all of the dual mode switches selectively.

For a ladder structure using magnetic bubble domain technology, a biased field souce 28 provides a magnetic biased field $H_z$ for stabilizing the size of the domains in magnetic medium 16. A propagation field source 30 provides a rotating magnetic field H in the plane of the magnetic medium for movement of the domains.

A control circuit 32 provides timing and control signals to switch control unit 10, biased field source 28, propagation field source 30 and to the read 22, clear 24 and write 26 circuits associated with the I/O loop.

The biased field source 28 and the propagation field source 30 are also well known in bubble domain technology. For example, a biased field $H_z$ can be readily implemented by a current carrying coil, a permanent magnet, or by an exchange coupled layer located on the magnetic field 16. The propagation field source 30 is conveniently implemented by a plurality of current-carrying coils located around magnetic medium 16.

In the specification, "on" and "off" designate the crossover status of the switch wherein "on" means crossover and "off" means avoidance. Unless explicitly assumed otherwise, a switch is assumed to be normally "off". The multi-loop design in the apparatus described in the co-pending Chang application involves one small loop and N large, double-sized loops linked by the dual mode switches. All but one of the switches are set in synchronism. In the embodiment of this invention, however, attention is directed to more flexible switch controls with uniform size loops.

Figure 2:
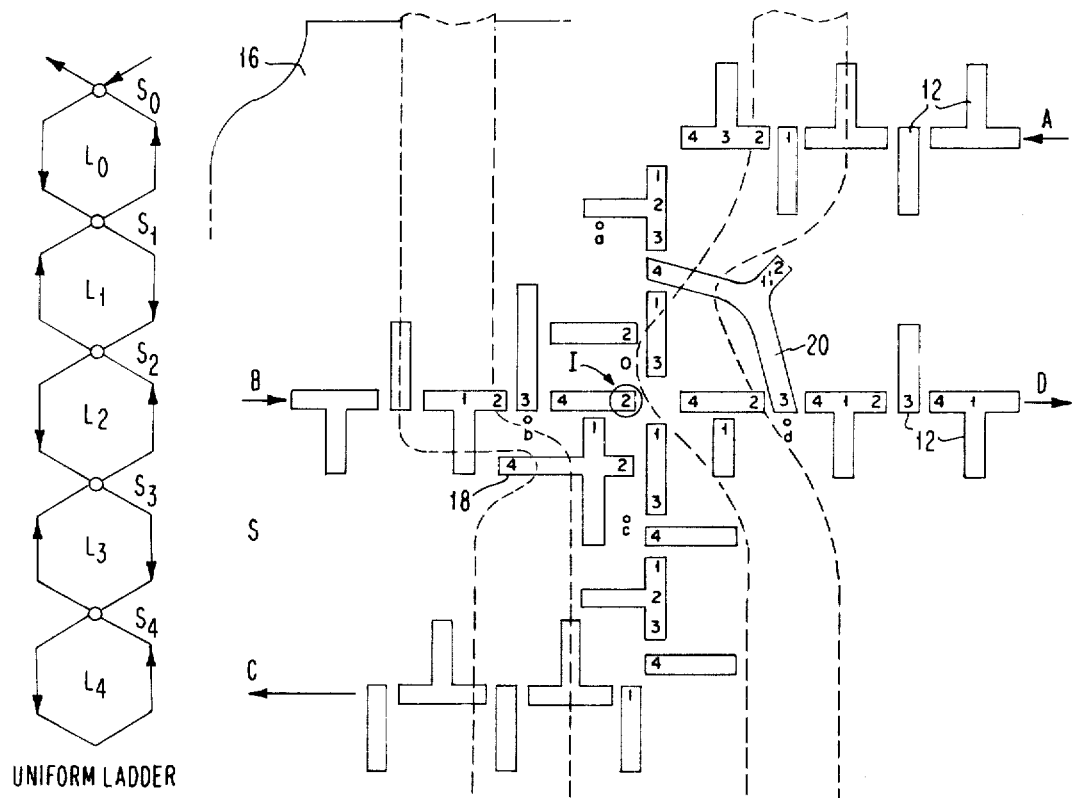
FIG. 2 diagramatically illustrates a linked ladder of equal length loops within which migration of a record in any loop can be switchably exchanged for the record in an adjacent neighbor loop.

Referring now to FIG. 2, there is shown a uniform ladder. It consists of a linear sequence of N shift regis-ter loops $L_i$, each with a capacity of $2m$ bits. Adjacent loops, say, $L_i$ and $L_{i+1}$, are linked by a dual mode switch $S_i+1$. For a N loop ladder, there are N-1 internal switches. A top switch $S_0$ is then used to link the ladder to the outside. The collection of switches lies in a straight line which symmetrically subdivides the ladder in two equal parts. It should be observed that two adjacent loops have opposite flow directions.

The N loop ladder will be used to hold N data items called records. Each record consists of $2m$ bits. A format of record R is set forth in FIG. 3. The format consists of a linear sequence of bits, subdivided into two halves. The first half designated FR (front of R) consists of bits $r_0-r_{m-1}$, and Br (back of R) consists of bits $r_m-r_{2m-1}$. The bits $r_0$, $r_m$, and $r_{2m-1}$ are called the head, waist and tail, respectively. In considering the behavior of the uniform ladder in a steadily shifting mode, it should be noticed that in one bit time, a given data bit will shift from one bit position to an adjacent bit position. If a switch $S_i$ is part of the shift path, the destination position will depend upon the setting of the switch. If the setting is off, the data bit will remain in the loop. Turning the switch on will cause a crossing of the loop boundary. It is observed that switch $S_i$ is without delay and its interposition along a path does not add to the shift delay.

Referring again to FIG. 2, it should be observed that the setting of $S_i$ to "off" effectively subdivides the ladder into two uncoupled subladders. The setting of all switches to off thus yields N subladders, each containing one circulating loop. Irrespective of the initial arrangement at time $T_0$, if all of the switches $S_i$ are turned off, the same arrangement will recur at the end of an integer number of periods. This is the analog of "no operation" for the dynamically shifting records, since the information is localized and is closest to being stationary. The setting with all switches off is termed the "idle setting", even if the duration is not equal to an integer number of loop circulating periods.

Given one record per loop, if the switch $S_i$ is turned on while all other switches remain off, then the contents of loops $L_{i-1}$ and $L_i$ will flow into each other. After one loop circulation period or loop cycle time, the exchange will be complete. If $S_i$ is then turned off again, then an exchange of records has been made. Significantly, this exchange takes place without the need of a buffer.

With the neighbor exchange mechanism used either one at a time or simultaneously involving many exchanges, arbitrary permutation can be achieved.

A notion of distance between loops $L_i$ and $L_j$ is defined to be $/i-j/$. The depth of $L_i$ is the distance between $L_i$ and $L_0$. This is simply equal to the numerical value of $i$. The movement of the record R from $L_i$ to $L_j$ where $j$ is less than $i$, can be executed in $(i-j)$ periods. This is accomplished through a series of neighbor exchanges using the settings starting at time $t_s$ for $k=0, 1, \ldots (j-i-1)$, where $S_{i-k}$ is on during $(t_s+k-1, t_s+k)$, and off otherwise. It is emphasized again that all unspecified switches are assumed to be off. A similar relationship holds for $i$ greater than $j$. In either case, the rate of data movement is one loop per period, using this neighbor exchange mechanism.

As record R moves steadily towards $L_j$ it interchanges positions with a different neighbor at each loop. Consequently, after it has reached the destination, all intervening records, initially at $L_K$, where $j \leq i<i$, will have been displaced towards $L_i$ by the distance of one loop. Such data movement, as previously suggested in the summary, is important in storage management. It can be viewed as "climbing" over the distance $(i-j)$. The special case where $j=0$, of climbing to the top, is called "topping". It is also termed "dynamic ordering" or dynamic reallocation" in the literature.

Figures 4A, 4B:
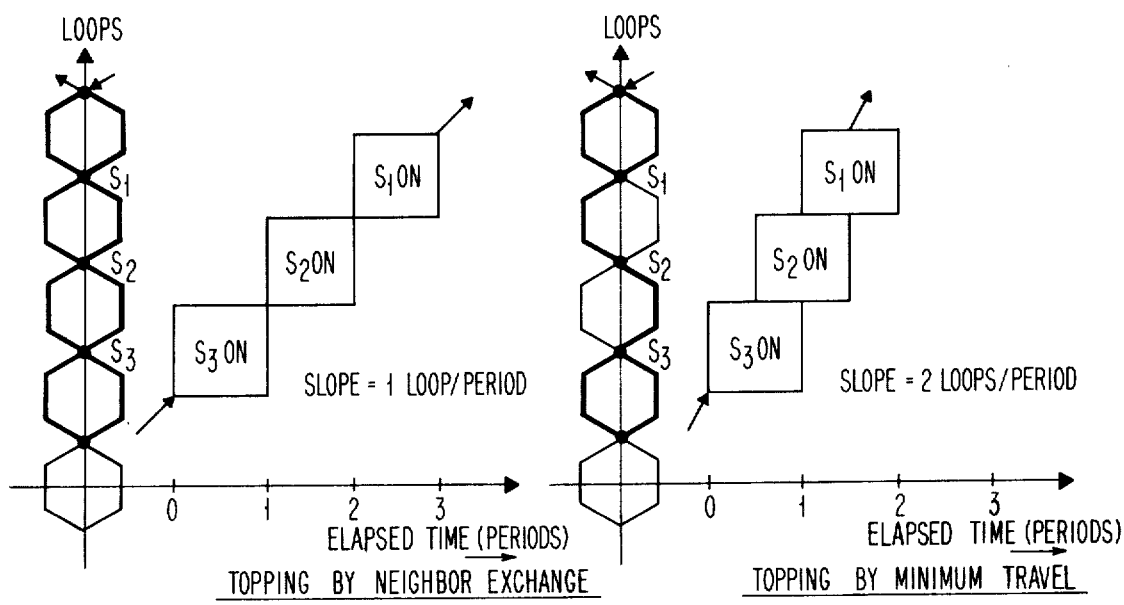
FIGS. 4A and B relate, respectively, to a form of transposition exchange sorting termed "topping", respectively, by neighbor exchange and by minimum travel.

It was unexpectedly observed that the climbing of a record over distance D, that is, from $L_i$ to $L_i$-D, can be executed in exactly $(D+1)/2$ loop cycle times or periods using the settings for $K=0, 1, \ldots, (D-1)$. In this regard, $S_{i-k}$ is on during $(t_s+k/2, t_s+k/2+1)$, and off otherwise. Involved in this observation were the additional observations that a path to the top need only involve one side of each intervening loop, i.e. $(L_{i-k}$, where $1 \leq k < D$). To effectuate this, it is necessary to fire $S_{i-k-1}$ half of a period before $S_{i-k}$ is reset to off. The time saving is achieved by the dual processing that is the overlapping of two "crossover" settings. One neighbor exchange is only half-complete before the next neighbor exchange is started. The instantaneous climbing speed is two loops per period with an overhead of half of a period. Referring now to FIGS. 4A and 4B, there is graphically illustrated the topping operation by simple neighbor exchange and topping by overlapping the crossover settings to achieve migration by minimum travel. As suggested in simple neighbor exchange, the slope of distance versus elapsed time is one loop per period, whereas the slope is two loops per period given the overlap of crossover settings. In the uniform ladder of both FIGS. 4A and B, there is effectively compared the switch settings for the two schemes of topping from a depth of 4.

Figure 5:
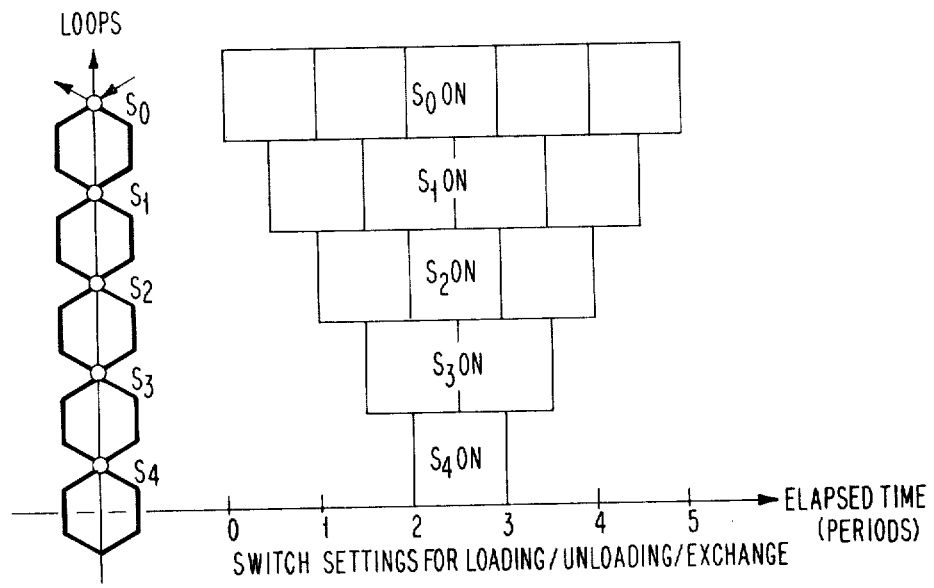
FIG. 5 delineates the switch settings for loading/unloading and exchange.
Figure 6:
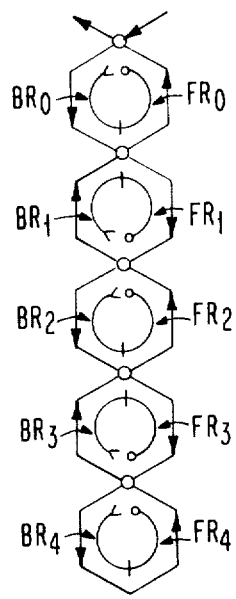
FIG. 6 shows an arrangement of filed records in a uniform ladder poised for output.

Referring now to FIG. 5, there is shown the switch settings for the loading, unloading and record exchanges of the uniform loop ladder. As the switch $S_i$ controls the flow into and out of the subladder below it, so does the top switch $S_0$ control the ladder to the outside world. In order for an external record $R_j$ to reach loop $L_j$, it must pass sucessively through $S_0, \ldots, S_j$. The minimum requirement is that the switches are fired in succession wherein each individual firing lasts one full period. Similar to the fast topping case, only one side of any loop is needed for the travel. Hence, the initiation of the switch settings can be made to occur at half-period intervals. Further, if $S_{j+1}$ is off when $R_j$ reaches it, the record will circulate in loop $L_j$ a half-period later. The total time consumed by this procedure for "filing" record $R_j$ in loop $L_j$ is $(j+1)/2$ periods.

If $R_{j-1}$ needs to be filed in loop $L_{j-1}$, the same propagation path is needed. It is necessary, however, to avoid affecting the contents of loop $L_j$. If record $Rj_{-1}$ can follow record $R_j$ immediately, the switches $S_0, \ldots, S_{j-1}$, having been turned on for record $R_j$, these switches can remain on for an extra period to allow passage of record $R_{j-1}$ Switch $S_j$ must, however, be turned off immediately after record $R_j$ passes; record $R_{j-1}$ being denied access to loop $L_j$ will circulate or "coil up" in loop $L_{j-1}$ a half period later. The procedure can be extended to fill the entire ladder with a continuous stream of N external records, $R_{N-1}, \ldots, R_0$. This is analogous to the filling of a pipe line with one end of the pipe line being successively shortened at half-period intervals. The switch settings over the interval $i=0, \ldots, (n-1)$ is for switch $S_i$ being on during $(t_s+i/2, t_0+N-i/2)$, and being off otherwise. The total loading time is therefore N periods exactly.

FIG. 5 shows the setting sequences to load a 5 loop ladder. The diagram is symmetric in time so that the same settings can be used for unloading the entire ladder as weel as loading it. The record at the top-most ladder loop is unloaded first. A lower switch must be turned on only at the proper instant for the subladder below it to unload. After N periods, the unloading will be complete. It is observed that the first record to be loaded migrates to the ladder bottom and this is the last record to be unloaded. On the other hand, the last-entered record is the first to come out. Thus, the uniform ladder honors the last-in, first-out discipline typical for stacks.

Both load and unload operations are, thus, identical. As an outside record is being loaded, a ladder record is actually simultaneously being unloaded in exchange. Exchange is, thus, fundamental to the uniform ladder in both internal data movement and in input/output operations as well. Parenthetically, in order to obtain a true exchange of records it is not necessary to first unload and then reload the ladder with new contents. The input/output process can be done concurrently in N periods, rather than 2N periods.

One now arrives at the notion of "internal block transfer". An internal block transfer is defined as the interchange of contents between two subladders of equal size. This is done by viewing the switch separating the two subladders as an I/O switch in which each subladder treats the other as the external or outside environment. For example, the contents of $L_0$-$L_{M-1}$ can be exchanged with the contents of loop $L_M$-$L_{2M-1}$ in exactly M periods. If the switch $S_{2M}$ is off during the operation, the contents below switch $S_{2M}$ will remain unaffected. The switching scheme requires that switch $S_{M \pm k}$ is on during $(t_s+k/2, t_s+M-k/2)$ and off otherwise for $k=0,1,2, \ldots M-1$.

The question can be invoked as to what measures insure that the records in a uniform ladder are not mutilated, that is, not broken up into disjointed pieces and, indeed, can be read out in the correct bit sequence. Clearly, a record is not mutilated if an apparatus can guarantee that the entire record can be coiled inside a loop. This record is said, then, to be filed in that loop. An arrangement in which all records are filed is termed a "filed arrangement". The movement of unfiled record R is serial if bit $r_i$ passes a monitoring point within the loop at time $t_s+j/2m$. If $r_j$ passes a point at time $t_s+[(j-n) \mod 2m]/2m$, then bits $(r_n, \ldots, r_{2m-1})$ will be positioned ahead of bits $(r_0, \ldots, r_{n-1})$, and the movement is said to be cyclic-serial. It is apparent that serial movement is a special case of cyclic serial movement.

Starting at time $t_0$, M records can be loaded serially into the uniform ladder in exactly N periods. Upon completion time, $t_1=t_0+N$, the ladder assumes the appearance in FIG. 6. It is noted that all records are filed with the front half occupying the right side of the ladder. Furthermore, the head bits (see format in FIG. 3) of all record occupants of the odd subscripted loops at the bottom, poised for movement downward. The head bit of all occupants of the even subscripted loops are on top ready for movement upward. In particular, the record in the top loop is poised for serial exit. This serial exit conditioned at the top loop recurs at full period intervals, that is, for $t=t_1+k$, $k$ being an integer, irrespective of the settings of the switches in the interim. Thus, the act of loading serves also the purpose of initializing the arrangement of all the records in a symmetric manner. The integrity of the records can then be preserved by operations tending to map one organized arrangement into another.

The operations performable by the apparatus of the invention include idling for any duration, record exchange between adjacent loops within one loop cycle time, and topping at distance D from the top within (D+½) cycle times.

Figure 7:
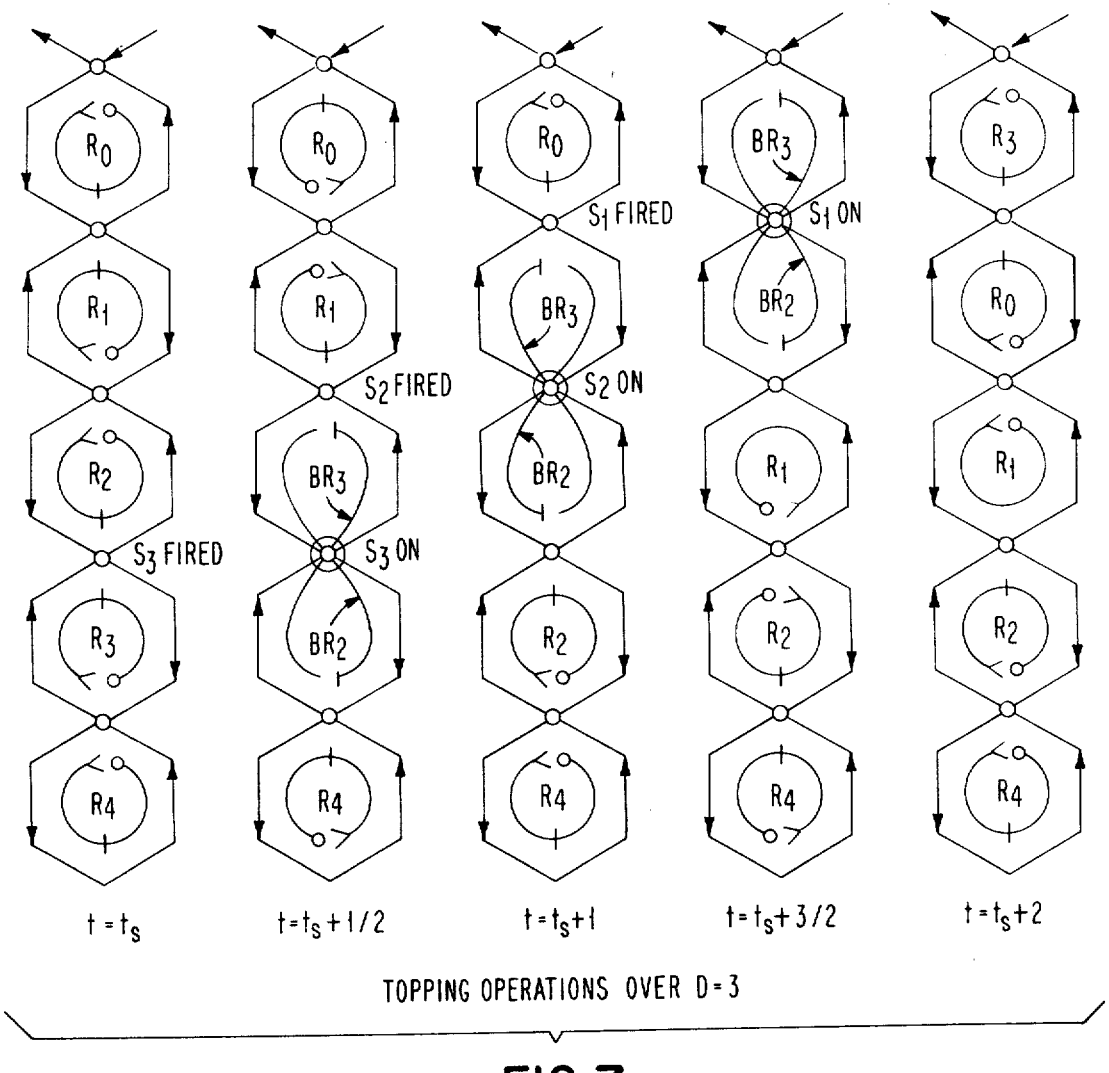
FIGS. 7 and 8 show topping operations, respectively, over D=3 and D=2 as a function of half-loop cycle time.
Figure 8:
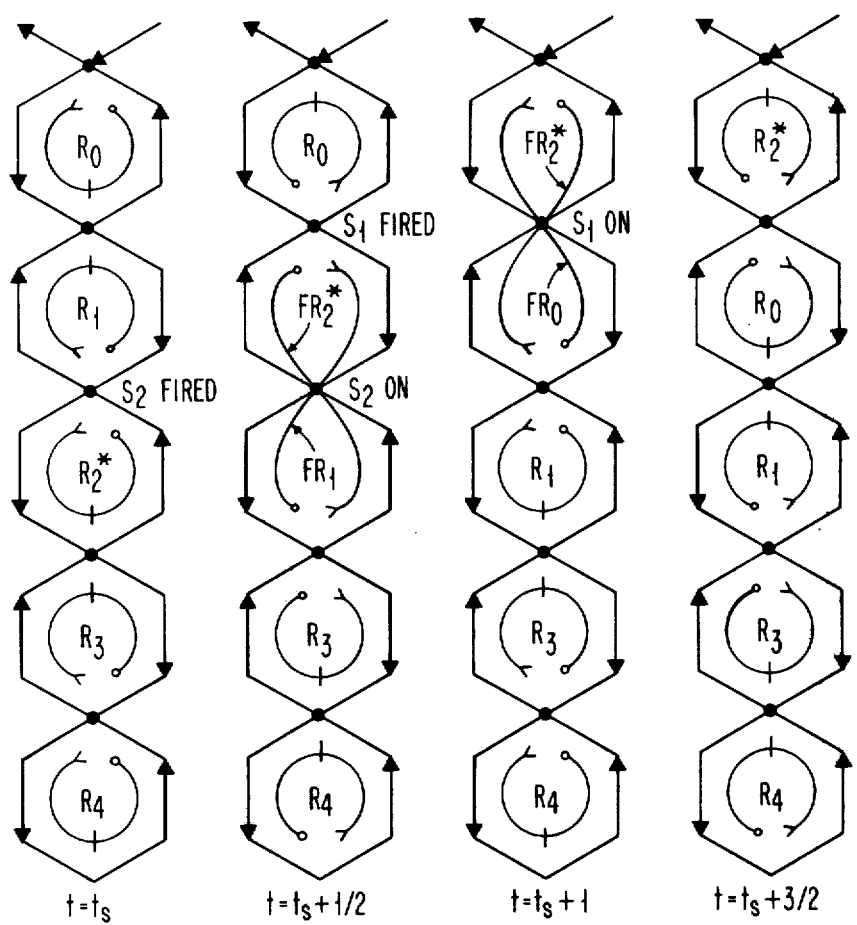

Referring to FIGS. 7 and 8, there is shown the migration of records in topping operations for, respectively, a distance D=3 and D=2. Suppose in FIG. 7 it is desired to move the record $R_3$ at time $t=t_s$. Switch $S_3$ is fired at time $t=t_s+½$ cycle times. Records R2 and R3 are exchanged. Also, switch $S_2$ is fired. This exchange of records and progression continues until $t=t_s+2$ at which time record $R_3$ is in the top-most loop $L_0$. The same migration can be followed for record $R_2$ in FIG. 8. In both figures the migration time is equal to $(D+1)/2$ cycle times.

In automatic storage management, the object is to arrange dynamically in linear order all data items based upon the relative probability of immediate useage. During execution time, the access pattern alters and this is reflected in the redistribution of the probabilities of useage. In this sense, dynamic storage allocation consists of rearranging the records to reflect the changing patterns or frequencies of use. In the absence of a' priori knowledge of a program and its data requirements, the access of one record should raise its probability for immediate reuseage. In contrast, records previously accorded a higher ranking should now be accorded a lower ranking. In the ranking according to frequency of useage qua probability, the accessed record should migrate upward and other records formerly of higher rank should migrate downward. This, in turn, leads to an allocation algorithm to the effect that whenever a record is accessed, it is assigned the highest probability for immediate reuse and should be migrated to the top of the ladder while all intervening records should drop down by one position. Restated, access is always associated with topping. This algorithm, termed the MRU (most recently used) algorithm, is illustrated with two cases of topping as set forth in FIGS. 7 and 8.

The uniform ladder implements the MRU algorithm by associating the topping operation with fetch and replace (or read and write) I/O operations. In terms of this algorithm, for example, "read from the ladder" should be construed as "top and copy" and the operation "write into the ladder" should mean "top and replace". In this regard replacement is considered as a partial I/O operation involving one record, copying being done by attaching a sensing or replication device at the top loop.

The behavior of a dynamically managed uniform ladder using MRU is similar to a PUSH DOWN stack. It is well appreciated from the art that a PUSH DOWN stack is a one-dimensional, multi-level data structure for use in describing parenthesis-free computations. Data items are loaded and unloaded, one at a time, through the top. The loading action pushes all resident data items down uniformly by one level. This frees the top level for the new entry. The unload action pops all resident records up by one level. This frees the top member to the environment. Consequently, the last-entered data item is the first to emerge. This satisfies the last-in, first-out discipline.

Figure 9:
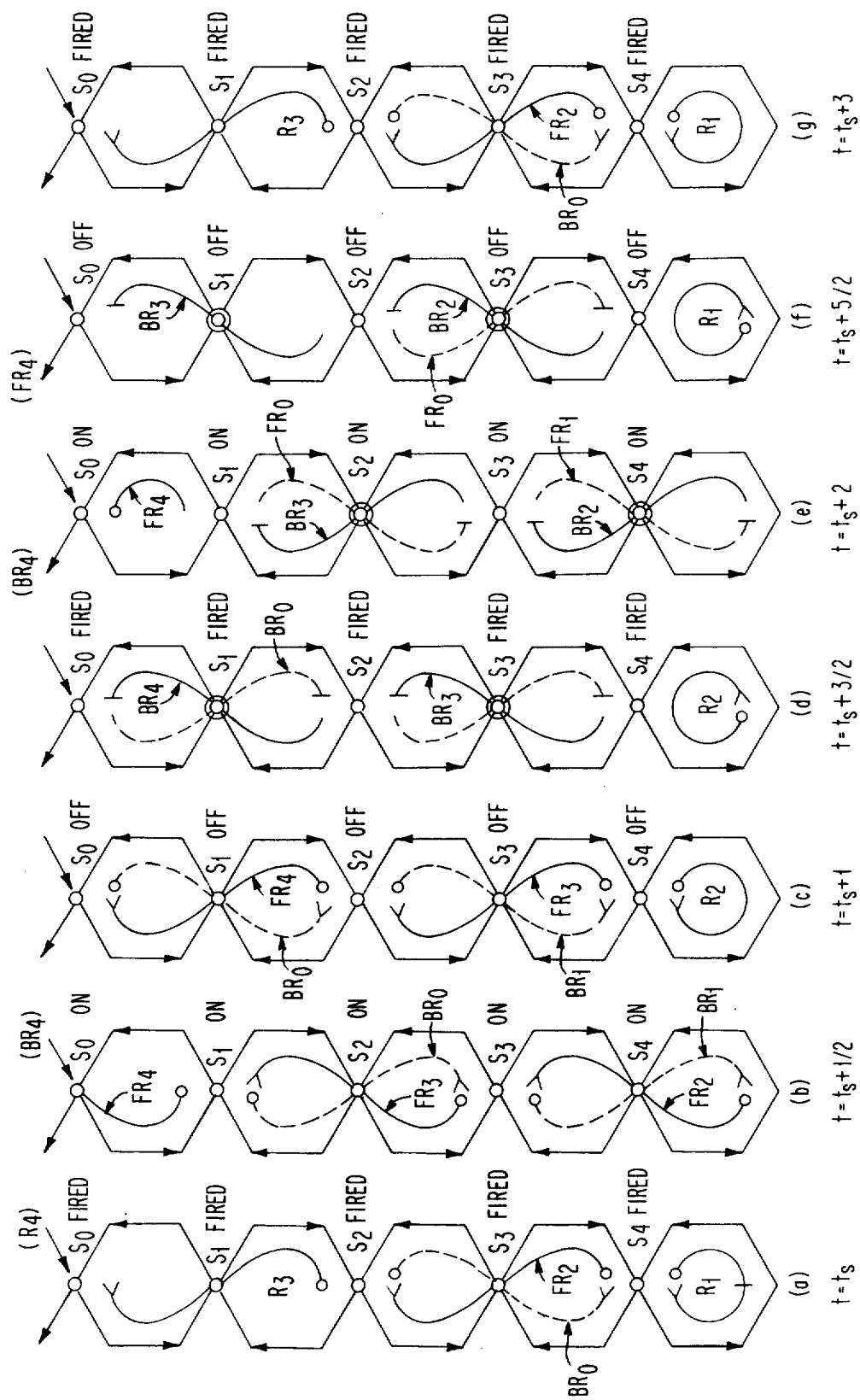
FIGS. 9A–G exhibites the migration of records in a uniform ladder operable as a push-down stack.

Referring now to FIG. 9, there is shown a uniform ladder operable as a PUSH DOWN stack. The stacks, read from left-to-right, i.e. 9A–G, depict record migration and exchanges in the loops starting from time $T=T_5$ through $T_5+3$. A five-loop stack is shown with five switches $S_0$ through $S_4$. When the switch $S_i$ is fired, this is indicative that it is changing its mode from "first" to "second" mode. When a switch is indicated as being on, it is being maintained in the second mode.

The PUSH DOWN stack operation include PUSH DOWN or "loading", idling, and POPPING UP or "unloading". In the PUSH DOWN operation, all of the switches $S_0$ through $S_4$ are set in the second mode for one loop latency time, i.e. in the interval $T_s$  $T<T_s+1$.

FIGS. 9A and B shows the configuration of the stack before and after the first loop latency time. It will be recalled from FIG. 3 that record R can be conceived as having a head, a waist and a tail with the first half-record FR symbolized as having entered the indicated loop with the other half of the record still remaining in the prior loop. The second half of a record BR is indicated by a tail.

At time $T_s+½$, the first half of a new record $R_4$ has been loaded through switch $S_0$ into loop $L_0$. As may also be recalled from the discussion on "topping", a record can traverse one side of a loop in one half loop latency time. Records $R_1$ and $R_0$ now have migrated upwards as records $R_3$ and $R_2$ have migrated downwards. At time $T_s+1$, record $R_4$, straddles loops $L_0$ and $L_1$; $R_3$ straddles $L_2$ and $L_3$ respectively, $R_2$ is coiled in loop $L_4$, while record $R_1$ straddles loops $L_2$ $L_3$ and $R_0$ straddles loops $L_0$ and $L_1$ respectively.

Starting at time $T_s+3/2$, it is desired to unload record $R_4$ which takes a full loop latency time.

The POP UP is accomplished by setting all switches $S_0$ through $S_4$ into the second mode at time $T_s+3/2$ for one loop latency time. In between the loading and unloading operations and vis a' vis all of the switches should be set into the first mode.

The stack is said to be "idling" if all of the switches are set in the first mode for an integral number of loop latency times. The configuration of the stack recurs while it is idling at the end of the idling duration.

The dual mode switch shown in FIGS. 1A–C can be implemented in technologies other than guided bubble technology. For instance, instead of an external conductor control of the mode of operation of the switch, a bubble-domain loadable switch of the type shown in co-pending U.S. patent application, Ser. No. 429,411, filed Dec. 28, 1973, can be used. Additionally, while T and I are shown to guide the movement of data bubbles, any type of a bubble propagation scheme can be utilized. Also, the dual mode switch shown utilized in FIG. 1C as an idler circuit as a major component thereof is not mandatory.

Additionally, the movement of bubble domains in a magnetic medium is not unlike the movement of charge in a semiconductive medium. Therefore, the propagation circuitry and switch circuitry can be implemented using semiconductor charge-coupled devices. In such circuitry, the charge is moved by voltage pulses appearing on conductor lines where repetitive phases of voltage pulses are used to continually move the charge. The switch can be implemented by standard electronic circuitry, for example, by one skilled in the art. Therefore, the operation of the switch can be duplicated in charge-coupled device circuitry.

What is claimed is:

1. In an apparatus for rearranging N identifiable 2m bit equal fixed length records $\{R_i\}$, said apparatus including an externally controllable permutation network; and information handling means adapted to be responsive to the records in the order of their arrival for loading the records into the network; for developing and applying control signals to the network so as to effectuate the physical rearrangement of the records, said signals being derived from comparisons of record identification indicia according to a predetermined algorithm; and for unloading the network; wherein the improved permutation network comprises: loop having a latency of 2m bit times;

N selectively operable dual mode switches $S_0$ to $S_{N-1}$, the switches being connected to the loops so as to form a linked linear ladder structure; switch $S_{N-1}$ for loop $L_{N-1}$, or switches $S_i$ and $S_{i+1}$ bounding any given loop $L_i$ other than $L_{N-1}$, upon being set into the first mode by a control signal maintains the given loop as a circulating path; furthermore, any switch $S_i$ between any given pair of adjacent loops $L_{i-1}$ and $L_i$ upon being set into the second mode by a control signal, provides a unidirection crossover path connection between the adjacent loops $L_{i-1}$ and $L_i$; loop $L_0$ communicating with an input/output port; the loops and switches being lexically ordered in increasing sequence from 0 through N−1.

clocking means for causing all loops to move their contents, if any, in synchronism.

2. In an apparatus according to claim 1, wherein the unidirectional crossover path connection is maintained for the duration of the common boundary switch being in the second mode, and further wherein the other boundary switches to the given pair of adjacent loops being set in the first mode, then there is formed a single circulating path having twice the latency of a single loop such that for $p+1$ consecutive loops being bounded by switches being set into the first mode but with all internal switches being set into the second mode, then there is formed a single circulating path having $p+1$ times the latency of a single loop.

3. In an apparatus according to claim 1, wherein the loop cycle time is defined to be the time taken for a record $R_i$ to complete one revolution about loop $L_i$ and also equivalent to the loop latency time.

4. In an apparatus according to claim 1, wherein each equal length shift register loop is formed from a guided magnetic bubble domain shift register.

5. A method for rearranging in a predetermined manner N identifiable 2m bit equal fixed length records $\{R_i\}$ stored in N equal length shift register loops $\{L_j\}$, one record to each loop, each loop having a latency of 2m bit times, said loops being connected by N-1 selectively operable dual mode switches $\{S_k\}$ to form a linked linear ladder structure, said loops and switches from end-to-end being lexically designated $L_0$ to $L_{N-1}$ and $S_0$ to $S_{N-1}$; $S_0$ being the switch coupling loop $L_0$ to an input/output port, the switch $S_{N-1}$ for loop $L_{N-1}$ or switches $S_i$ and $S_{i+1}$ bounding any given loop $L_i$ other than $L_{N-1}$, upon being set into a first mode, maintains the given lop as a circulating path; any switch $S_i$ between any given pair of adjacent loops $L_{i-1}$ and $L_i$, upon being set into a second mode, provides a unidirectional crossover path connection between the adjacent loops, wherein the method comprises the steps of loading, rearranging and unloading records into and from the ladder structure; and further wherein the rearranging step comprises:

moving a record in any given loop $L_j$ to any other given loop $L_i$, $j-i = D > 0$, in $(D+1)/2$ loop latency times through a series of record exchanges such that starting at time $T_S$ and for $k=0, 1, 2, \ldots,$ $(D-1)$, switch $S_{j-k}$ is set into the second mode during interval $(T_S+k/2; T_S+k/2+1)$ and into the first mode otherwise.

6. A method for rearranging in a predetermined manner N identifiable 2m bit equal fixed length records $\{R_i\}$ stored in N equal length shift register loops $\{L_j\}$, one record to each loop, each loop having a latency of 2m bit times, said loops being connected by N-1 selectively operable dual mode switches $\{S_k\}$ to form a linked linear ladder structure, said loops and switches from end-to-end being lexically designated $L_0$ to $L_{N-1}$ and $S_0$ to $S_{N-1}$; $S_0$ being the switch coupling loop $L_0$ to an input/output port, the switch $S_{N-1}$ for loop $L_{N-1}$ or switches $S_i$ and $S_{i+1}$ bounding any given loop $L_i$ other than $L_{N-1}$, upon being set into a first mode, maintains the given loop as a circulating path; any switch $S_i$ between and given pair of adjacent loops $L_{i-1}$ and $L_i$, upon being set into a second mode, provides a unidirectional crossover path connection between the adjacent loops, wherein the method comprises the steps of loading, rearranging and unloading records into and from the ladder structure; and further wherein the rearranging step comprises:

moving a record in any given loop $L_i$ to any other given loop $L_j$, $j-i = D>0$, in $(D+1)/2$ loop latency times through a series of record echanges such that starting at time $T_S$ and for $k=0, 1, 2, \ldots, (D-1)$, switch $S_{i+k}$ is set into the second mode during interval $(T_S+k/2; T_S+k/2+1)$ and into the first mode otherwise.

7. A method for rearranging in a predetermined manner 2M identifiable 2m bit equal fixed length records stored in 2m equal shift register loops $\{L_j\}$, one record for each loop, each loop having a loop latency of 2m bit times, said loops being connected by 2M−1 seletively operable dual mode switches $\{S_k\}$ to form a linked linear structure, said loops and switches from end-to-end being lexically designated $L_0$ to $L_{2M-1}$ and $S_1$ to $S_{2M-1}$; $S_0$ being the switch coupling loop $L_0$ to an input/output port, the switch $S_{2M-1}$ for loop $L_{2M-1}$ or switches $S_i$ and $S_{i+1}$ bounding any given loop $L_i$ other than $L_{2M-1}$ upon being set into a first mode, maintains the given loop as a circulating path; any switch $S_i$ between any given pair of adjacent loops $L_{i-1}$ and $L_i$, upon being set into a second mode, provides unidirectional crossover path connection between the adjacent loops, wherein the method comprises the steps of loading rearranging and unloading records into and from the structure, and further wherein the rearranging step comprises:

exchanging records in loops $L_0$ to $L_{M-1}$ with the records in loops $L_M$ to $L_{2M-1}$ in M loop latency times through a series of record swaps such that starting at time $T_S$ and for latency times $k=0, 1, 2, \ldots,$ M-1, switch $S_{2M}$ selectively is set into the first mode for the entire interval and that switches $S_{M+k}$ and $K_{M-k}$ are set into the second mode during the interval $(T_S + k/2, T_S + M - k/2)$ and into the first mode otherwise.

8. A method for rearranging in a predetermined manner N identifiable 2m bit equal fixed length records $\{R_i\}$, the record format having front and back halves, the records being storable in corresponding ones of N equal length shift register loops $\{L_j\}$, each loop having a latency of 2m bit times, said loops being connected by N−1 selectively operable dual mode switches $\{S_k\}$ to form a linked linear ladder structure, said loops and switches from end-to-end being lexically designated $L_0$ to $L_{N-1}$ and $S_0$ to $S_{N-1}$, the switch $S_{N-1}$ for a loop $L_{N-1}$ or switches $S_i$ and $S_{i+1}$ bounding any given loop $L_i$ other than $L_{N-1}$, upon being set into a first mode, maintains the given loop as a circulation path; any switch $S_i$ between any given pair of adjacent loops $L_{i-1}$ and $L_i$ upon being set into a second mode, provides a unidirectional crossover path connection between the adjacent loops, wherein the method comprises the steps of loading, idling and unloading records into and from the ladder network on a last-in, first-out basis; and further wherein adjacent loops $L_{2k}$ and $L_{2k-1}$, $0<k>N/2$ representing PUSH DOWN levels $P_k$ and $P_{N-k-1}$ such that records occupying the respective loops, each straddle both loops evenly with a half-record in each loop; when poised for loading the contents of $P_{N-k-1}$ point with the front half toward loop $L_{N-1}$ while the contents of $P_k$ point with the front half toward loop $L_0$; when poised for unloading the contents of $P_{N-k-1}$ will point with the front half toward loop $L_0$, while the contents of $P_k$ will point with the front half toward loop $L_{N-1}$;

for loading a record at time $T_s$, switches $S_0$ through $S_{N-1}$ are set into the second mode for one loop latency time (FIG. 9a, b, c); for unloading a record at time $T_s+\frac{1}{2}+k$ switches $S_0$ through $S_{N-1}$ are set into the second mode for one loop latency time (FIG. 9d, e, f); for idling switches $S_0$ through $S_{N-1}$ are set into the first mode for an integral number of loop latency times between the loading and unloading of the structure and vis a' vis.

9. An improved externally controllable permutation network for reordering N identifiable $2m$ bit equal fixed length records comprising:

N equal length shift register loops $L_0$ to $L_{N-1}$, each loop having a latency of $2m$ bit times;

N selectively operable dual mode switches $S_0$ to $S_{N-1}$, the switches being connected to the loops so as to form a linked linear ladder structure; switch $S_{N-1}$ for loop $L_{N-1}$ or switches $S_i$ and $S_i^+{}_1$ bounding any given loop $L_i$ other than $L_{N-1}$, upon being set into the first mode by a control signal maintains the given loop as a reentrant path; furthermore, any switch $S_i$ between any given pair of adjacent loops $L_{i-1}$ and $L_i$ upon being set into the second mode by a control signal, provides a unidirection crossover path connection between the adjacent loops $L_{i-1}$ and $L_i$; loop $L_0$ being operative as a record input-/output port; the loops and switches being lexically ordered in the same direction; and clocking means for causing all loops to move their contents, if any, in synchronism.

10. A method for rearranging in a predetermined manner N identifiable $2m$ bit equal fixed length records '$R_i$' stored in N equal length shift register loops '$L_i$', one record to each loop, each loop having a latency of $2m$ bit times, said loops being connected by N-1 selectively operable dual mode switches '$S_k$' to form a lined linear ladder structure, said soops and switches from end-to-end being lexically designated $L_0$ to $L_{N-1}$ and $S_0$ to $S_{N-1}$; $S_0$ being the switch coupling loop $L_0$ to an input/output port, the switch $S_{N-1}$ for loop $L_{N-1}$ or switches $S_i$ and $S_{i+1}$ bounding any given loop $L_i$ other than $L_{N-1}$, upon being set into a first mode, maintains the given loop as a circulating path; any switch $S_i$ between any given pair of adjacent loops $L_{i-1}$ and $L_i$, upon being set into a second mode, provides a unidirectional crossover path connection between the adjacent loops, wherein the method comprises the steps of loading, rearranging and unloading records into and from the ladder structure, and further wherein the loading step comprises:

serially filling the ladder structure with records $R_{N-1}$, $R_{N-2}, \ldots, R_0$ in N loop latency times such that for $k = 0, 1, 2, 3, 4, \ldots, N-1$, each switch $S_k$ is set into the second mode starting at time $T_s$ during the interval $(T_s + k/2, T_s + N - k/2)$ and into the first mode otherwise;

and still further wherein the unloading step comprises:

serially emptying the ladder structure in the rearranged record order starting with the contents of loop $L_0$ to loop $L_{N-1}$, said emptying occurring in N loop latency times such that for $k = 0, 1, 2, \ldots$ N=1, each switch $S_k$ is set into a second mode starting at time $T_s'$ during the interval $(T_s'+k/2, T_s+N-k/2)$ and into the first mode otherwise.

* * * * *

UNITED STATES PATENT AND TRADEMARK OFFICE
CERTIFICATE OF CORRECTION

PATENT NO. : 3,997,880
DATED : December 14, 1976
INVENTOR(S) : T. C. Chen, et al It is certified that error appears in the above-identified patent and that said Letters Patent are hereby corrected as shown below:

In col. 5, line 27 change "50,51,52,53,54" to --S0,S1, S2,S3,S4--

In col. 5, line 29 change "50" to --S0-- and change "51-54" to --S1-S4--

In col. 5, line 32 change "51-54" to --S1-S4--

In col. 6, line 3 change "$S_i+1$" to --$S_{i+1}$.--

In col. 11, line 12 and 13 after network comprises: add --N equal length shift register loops $L_0$ to $L_{N-1}$, each--

In column 12, line 58 delete the word [selectively].

In column 13, line 13 change "0<k>N/2" to -- $0 \leq k < N/2$ --.

Signed and Sealed this

Nineteenth Day of April 1977

[SEAL]

Attest:

RUTH C. MASON
*Attesting Officer*

C. MARSHALL DANN
*Commissioner of Patents and Trademarks*